(12) United States Patent
Wang (10) Patent No.: US 8,072,023 B1
(45) Date of Patent: Dec. 6, 2011

(54) ISOLATION FOR NON-VOLATILE MEMORY CELL ARRAY

(75) Inventor: Chih-Hsin Wang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 270 days.

(21) Appl. No.: 12/262,599

(22) Filed: Oct. 31, 2008

Related U.S. Application Data (60) Provisional application No. 60/987,207, filed on Nov. 12, 2007.

(51) Int. Cl.
*H01L 29/788* (2006.01)
(52) U.S. Cl. ......... 257/321; 257/E29.304; 257/E21.206; 257/E21.545; 438/266
(58) Field of Classification Search .................. 257/314, 257/321, E29.304, E21.206, E21.545; 365/63; 438/266
See application file for complete search history.

(56) References Cited

U.S. PATENT DOCUMENTS

| | | | |
|---|---|---|---|
| 3,943,543 A | 3/1976 | Caywood | |
| 3,944,849 A | 3/1976 | Tasch, Jr. et al. | |
| 4,072,977 A | 2/1978 | Bate et al. | |
| 4,462,090 A | 7/1984 | Iizuka | |
| 4,698,787 A | 10/1987 | Mukherjee et al. | |
| 4,957,877 A | 9/1990 | Tam et al. | |
| 5,029,130 A | 7/1991 | Yeh | |
| 5,053,839 A | 10/1991 | Esquivel et al. | |
| 5,070,480 A | 12/1991 | Caywood | |
| 5,095,344 A | 3/1992 | Harari | |
| 5,115,289 A | 5/1992 | Hisamoto et al. | |
| 5,146,426 A | 9/1992 | Mukherjee et al. | |
| 5,153,880 A | 10/1992 | Owen et al. | |
| 5,161,157 A | 11/1992 | Owen et al. | |
| 5,235,544 A | 8/1993 | Caywood | |
| 5,268,319 A | 12/1993 | Harari | |
| 5,270,980 A | 12/1993 | Pathak et al. | |
| 5,280,446 A | 1/1994 | Ma et al. | |
| 5,286,994 A | 2/1994 | Ozawa et al. | |
| 5,426,316 A | 6/1995 | Mohammad | |
| 5,429,965 A | 7/1995 | Shimoji | |
| 5,432,739 A | 7/1995 | Pein | |
| 5,517,044 A | 5/1996 | Koyama | |
| 5,523,243 A | 6/1996 | Mohammad | |
| 5,557,122 A | 9/1996 | Shrivastava et al. | |
| 5,559,735 A | 9/1996 | Ono et al. | |
| 5,563,083 A | 10/1996 | Pein | |

(Continued)

OTHER PUBLICATIONS

Bock et al; "3.3ps SiGe Bipolar Technology," Proceeding of the IEDM, pp. 255-258; 2004.

(Continued)

*Primary Examiner* — Wael Fahmy
*Assistant Examiner* — John C Ingham (57) ABSTRACT

A memory device including a plurality of storage regions arranged with storage region intervals. A plurality of conductor lines are juxtaposed the storage region intervals. One or more isolations are provided, each isolation adjacent one or more conductor lines and juxtaposed one or more of the storage regions that are dummy storage regions. The storage regions are charge storage regions in memory cells and each memory cell further includes a first cell region, a second cell region and a cell channel juxtaposed the charge storage region and located between the first cell region and the second cell region. A first array region and a second array region are separated by a first one of the isolations; each array region includes one or more groups of the memory cells where each memory cell includes one of the storage regions.

23 Claims, 5 Drawing Sheets

U.S. PATENT DOCUMENTS

| | | | |
|---|---|---|---|
| 5,621,738 | A | 4/1997 | Caywood et al. |
| 5,714,766 | A | 2/1998 | Chen et al. |
| 5,739,567 | A | 4/1998 | Wong |
| 5,764,096 | A | 6/1998 | Lipp et al. |
| 5,768,192 | A | 6/1998 | Eitan |
| 5,780,341 | A | 7/1998 | Ogura |
| 5,790,455 | A | 8/1998 | Caywood |
| 5,792,670 | A | 8/1998 | Pio et al. |
| 5,822,242 | A | 10/1998 | Chen |
| 5,838,039 | A | 11/1998 | Sato et al. |
| 5,847,427 | A | 12/1998 | Hagiwara |
| 5,847,996 | A | 12/1998 | Guterman et al. |
| 5,883,409 | A | 3/1999 | Guterman et al. |
| 5,966,329 | A | 10/1999 | Hsu et al. |
| 5,973,356 | A | 10/1999 | Noble et al. |
| 6,002,152 | A | 12/1999 | Guterman et al. |
| 6,080,995 | A | 6/2000 | Nomoto |
| 6,088,263 | A | 7/2000 | Liu et al. |
| 6,091,104 | A | 7/2000 | Chen |
| 6,103,573 | A | 8/2000 | Harari |
| 6,104,057 | A | 8/2000 | Nakanishi et al. |
| 6,172,898 | B1 * | 1/2001 | Kajiyama ............... 365/149 |
| 6,197,639 | B1 | 3/2001 | Lee et al. |
| 6,201,732 | B1 | 3/2001 | Caywood |
| 6,211,562 | B1 | 4/2001 | Forbes et al. |
| 6,303,940 | B1 | 10/2001 | Kizilyalli et al. |
| 6,313,487 | B1 | 11/2001 | Kencke et al. |
| 6,368,915 | B1 | 4/2002 | Montree et al. |
| 6,372,617 | B1 | 4/2002 | Kitamura |
| 6,384,451 | B1 | 5/2002 | Caywood |
| 6,388,922 | B1 | 5/2002 | Fujiwara et al. |
| 6,407,424 | B2 | 6/2002 | Forbes |
| 6,411,545 | B1 | 6/2002 | Caywood |
| 6,426,896 | B1 | 7/2002 | Chen |
| 6,449,189 | B2 | 9/2002 | Mihnea et al. |
| 6,451,652 | B1 | 9/2002 | Caywood |
| 6,469,343 | B1 | 10/2002 | Miura et al. |
| 6,479,863 | B2 | 11/2002 | Caywood |
| 6,503,785 | B2 | 1/2003 | Chen |
| 6,525,371 | B2 | 2/2003 | Johnson |
| 6,525,962 | B1 | 2/2003 | Pai et al. |
| 6,531,731 | B2 | 3/2003 | Jones et al. |
| 6,534,816 | B1 | 3/2003 | Caywood |
| 6,555,865 | B2 | 4/2003 | Lee |
| 6,566,706 | B1 | 5/2003 | Wang et al. |
| 6,574,140 | B2 | 6/2003 | Caywood |
| 6,580,124 | B1 | 6/2003 | Cleeves et al. |
| 6,580,642 | B1 | 6/2003 | Wang |
| 6,593,624 | B2 | 7/2003 | Walker |
| 6,621,107 | B2 | 9/2003 | Blanchard et al. |
| 6,680,505 | B2 | 1/2004 | Ohba et al. |
| 6,709,928 | B1 | 3/2004 | Jenne et al. |
| 6,721,205 | B2 | 4/2004 | Kobayashi et al. |
| 6,727,545 | B2 | 4/2004 | Wang et al. |
| 6,734,105 | B2 | 5/2004 | Kim |
| 6,743,674 | B2 | 6/2004 | Wang |
| 6,744,111 | B1 | 6/2004 | Wu |
| 6,745,370 | B1 | 6/2004 | Segal et al. |
| 6,747,310 | B2 | 6/2004 | Fan |
| 6,753,568 | B1 | 6/2004 | Nakazato et al. |
| 6,756,633 | B2 | 6/2004 | Wang et al. |
| 6,774,433 | B2 | 8/2004 | Lee et al. |
| 6,790,727 | B2 | 9/2004 | Jones et al. |
| 6,791,883 | B2 | 9/2004 | Swift et al. |
| 6,815,764 | B2 | 11/2004 | Bae et al. |
| 6,839,264 | B2 * | 1/2005 | Sekine et al. ............... 365/63 |
| 6,847,556 | B2 | 1/2005 | Cho |
| 6,853,583 | B2 | 2/2005 | Diorio et al. |
| 6,861,698 | B2 | 3/2005 | Wang |
| 6,873,006 | B2 | 3/2005 | Chen et al. |
| 6,882,572 | B2 | 4/2005 | Wang et al. |
| 6,894,339 | B2 | 5/2005 | Fan et al. |
| 6,894,343 | B2 | 5/2005 | Harari et al. |
| 6,897,514 | B2 | 5/2005 | Kouznetsov et al. |
| 6,936,884 | B2 | 8/2005 | Chae et al. |
| 6,936,887 | B2 | 8/2005 | Harari et al. |
| 6,952,032 | B2 | 10/2005 | Forbes et al. |
| 6,952,033 | B2 | 10/2005 | Kianian et al. |
| 6,953,970 | B2 | 10/2005 | Yuan et al. |
| 6,958,513 | B2 | 10/2005 | Wang |
| 7,015,102 | B2 | 3/2006 | Wang |
| 7,018,897 | B2 | 3/2006 | Wang |
| 7,074,672 | B2 | 7/2006 | Kianian et al. |
| 7,075,823 | B2 | 7/2006 | Harari |
| 7,115,942 | B2 | 10/2006 | Wang |
| 7,149,118 | B2 | 12/2006 | Diorio et al. |
| 7,190,018 | B2 | 3/2007 | Chen et al. |
| 7,259,984 | B2 | 8/2007 | Kan et al. |
| 7,274,068 | B2 | 9/2007 | Forbes |
| 7,307,308 | B2 | 12/2007 | Lee et al. |
| 2001/0029077 | A1 | 10/2001 | Noble et al. |
| 2002/0179958 | A1 | 12/2002 | Kim |
| 2004/0021170 | A1 | 2/2004 | Caywood |
| 2004/0042295 | A1 | 3/2004 | Fujiwara et al. |
| 2004/0160824 | A1 | 8/2004 | Kianian et al. |
| 2004/0214396 | A1 | 10/2004 | Wang et al. |
| 2005/0167734 | A1 | 8/2005 | She et al. |
| 2005/0243602 | A1 | 11/2005 | Umezawa |
| 2006/0001053 | A1 | 1/2006 | Wang |
| 2006/0006454 | A1 * | 1/2006 | Wang ............................ 257/314 |
| 2006/0233082 | A1 | 10/2006 | Lee et al. |
| 2006/0284236 | A1 | 12/2006 | Bhattacharyya |
| 2008/0203464 | A1 | 8/2008 | Wang |

OTHER PUBLICATIONS

C. A. Mead, "The Tunnel-Emission Amplifier", Proceedingss of the IRE, pp. 359-361, 1960.

Caywood, John M. et al; "A Novel Nonvolatile Memory Cell Suitable for Both Flash and Byte-Writable Applications"; IEEE Transactions on Electron Devices, vol. 49, No. 5, May 2002; pp. 802-807.

First Examination Report from the State Intellectual Property Office of the People's Republic of China dated Aug. 30, 2007 for Chinese Application No. 2005/100804259; 9 pages.

First Examination Report from the State Intellectual Property Office of the People's Republic of China dated Sep. 6, 2007 for Chinese Application No. 2005/100804314; 8 pages.

Fischetti et al; "Six-band k.p. calculation of hole mobility in silicon inversion layers: dependence on surface . . . ," Journal of Appl. Physics, vol. 94, pp. 1079-1095; 2003.

H. Fujiwara et al; "High-Efficiency Programming with Inter-Gate Hot-Electron Injection for Flash . . . ," Digest of Non-Volatile Semiconductor Memory Workshop, Feb. 2000; p. 127.

Hensel et al; "Cyclotron Resonance Experiments in Uniaxially Stressed Silicon; Valence Band Inverse Mass Parameters and Deformation . . . ," Phys. Rev. 129, pp. 1141-1062; 1963.

Hinckley et al; "Hole Transport Theory in Pseudomorphic Si1-xGex Allows Grown on Si(001) Substrates," Phys. Rev. B, 41, pp. 2912-2926; 1990.

Kitamura et al; "A Low Voltage Operating Flash Cell with High Coupling Ratio Using Horned Floating Gate with Fine HSG"; 1998 Symposium on FLSI Technology Digest of Technical Papers; pp. 104-105.

Kuo et al; "FEFET—A High Density, Low Erase Voltage, Trench Flash EEPROM"; 1994 Symposium on VLSI Technology Digest of Technigal Papers; pp. 51-52.

Lai, Stefan; "Flash Memories: Where We Were and Where We Are Going"; 1998 IEEE; pp. 971-973.

Lenzlinger and Snow; Fowler-Nordheim Tunneling into Thermally Grown SiO2; J. Appl. Phys. vol. 40, No. 1; Jan. 1969; pp. 278-283.

M. Heiblum et al; "Direct Observation of ballistic Transport in GaAs," pp. 2200-2203, vol. 55, Physical Review Letters; 1985.

Nicollian and Brews; "MOS Physics and Technology," Wiley-Interscience, 1982, "Photo I-V method—Basics"; pp. 512-515.

Pein, H. et al; "Performance of the 3-D Sidewall Flash EPROM Cell", IEDM Technical Digest, pp. 11-14, Dec. 1993.

S. Sze; "Physics of Semiconductor Devices"; Wiley-Interscience, 1981, "Schotky Effect", pp. 250-253.

SMA5111—Compound Semiconductors; Lecture 2—Metal-Semiconductor Junctions—Outline; C. G. Fonstad; Feb. 2003; 22 pages.

The International Search Report and the Written Opinion of the International Searching Authority, or the Declaration dated Jul. 16, 2008 for International Application No. PCT/US2008/063246 filed May 9, 2008; 12 pages.

Vogelsang et al; "Electron Mobilities and High-Field Drift Velocity in Strained Silicon on Silicon-Germanium Substrate", IEEE Trans. on Electron Devices, pp. 2641-2642; 1992.

Wang, Chih Hsin; "Three-Dimensional DIBL for Shallow-Trench Isolated MOSFET's"; IEEE Transactions on Electron Devices, vol. 46, No. 1, Jan. 1999; pp. 139-144.

* cited by examiner

ISOLATION FOR NON-VOLATILE MEMORY CELL ARRAY

CROSS-REFERENCED APPLICATIONS

This application claims the benefit under 35 USC 119(e) of Provisional Patent Application U.S. Ser. No. 60/987,207 entitled DESIGN ON ARRAY ISOLATION FOR EDGE AND STRAP, filed Nov. 12, 2007; Inventor: Chih-Hsin Wang. Application Ser. No. 60/987,207 is hereby incorporated by reference in its entirety in the present specification.

Patent application U.S. Ser. No. 11/932,481 entitled ELECTRICALLY ALTERABLE NONVOLATILE MEMORY AND ARRAY filed Oct. 31, 2007; Inventor: Chih-Hsin Wang. Application Ser. No. 11/932,481 is hereby incorporated by reference in its entirety in the present specification.

TECHNICAL FIELD

The present specification relates to semiconductor devices and semiconductor memory arrays and to methods for arranging such devices and arrays.

BACKGROUND

Non-volatile semiconductor memory arrays with memory cells having charge storage capability are well known in the art. Examples of such memory arrays are described in the cross-referenced application entitled ELECTRICALLY ALTERABLE NONVOLATILE MEMORY AND ARRAY.

Memory arrays are formed by locating memory cells with regular spacing designated as a cell pitch, CP. The cell pitch is a function of the feature size, F, of the cells. Smaller feature sizes permit smaller cell pitches and greater cell densities in memory arrays. Increased densities for memory arrays are in demand in order to increase the capacity and performance of semiconductor devices. As densities increase and cell pitches decrease, the structures of and steps for arranging the cells and the memory arrays become more critical. High reliability is desired for high density memory arrays.

There is a need for improved memory cells and arrays and steps for arranging memory cells and arrays having small cell pitches and high cell densities.

SUMMARY

Embodiments of the present invention are a memory device including a plurality of storage regions arranged with storage region intervals, a plurality of conductor lines and one or more isolations. Each isolation is adjacent one or more conductor lines and juxtaposed one or more of the storage regions that are dummy storage regions.

In an embodiment, one or more of the storage regions are charge storage regions in memory cells and each memory cell further includes a first cell region, a second cell region and a cell channel juxtaposed the charge storage region and located between the first cell region and the second cell region.

In an embodiment, a first array region and a second array region are separated by a first one of the isolations. Each array region includes one or more groups of the memory cells where each memory cell includes one of the charge storage regions.

In an embodiment, the isolation is an STI isolation or a LOCOS isolation.

In an embodiment, the conductor lines include first conductor lines extending in a first direction and the conductor lines further include second conductor lines extending in a second direction for electrically coupling the charge storage regions of a plurality of memory cells.

In an embodiment, contacts electrically couple the second conductor lines and in a further embodiment, each contact is juxtaposed an isolation and located adjacent a dummy charge storage region. In still further embodiments, the contacts connect to metallization lines.

In an embodiment, a first contact electrically couples a first one of second conductor lines in proximity to a first isolation and a second contact electrically couples a second one of the second conductor lines in proximity to a second isolation.

In an embodiment, the memory cells include tunneling gates and the conductor lines include a plurality of first tunneling lines for electrically coupling the tunneling gates and include dummy tunneling lines in proximity to the isolations.

In an embodiment having one or more isolations, two or more dummy tunneling lines extend in a first direction and one or more connecting lines extends in a second direction and connects two of the dummy tunneling lines.

The foregoing and other features and advantages of the invention will be apparent from the following detailed description in conjunction with the drawings.

DETAILED DESCRIPTION

Figure 1:
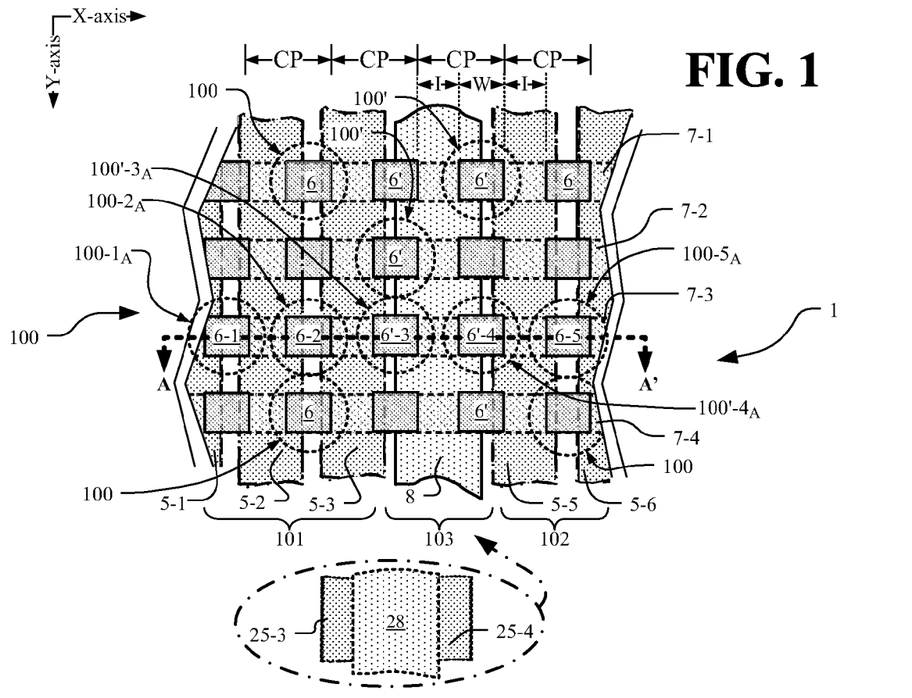
FIG. 1 depicts a top view of one embodiment of a memory device in accord with the present specification.

In FIG. 1, a top view of a memory device 1 is shown in accord with one embodiment the present specification. The memory device 1 includes a plurality of storage regions 6. The storage regions 6 are arrayed in a first direction (X-axis direction) with intervals, I, between and separating the storage regions 6. Each storage region 6 is capable of storing logical states (for example, a logical "1" or a logical "0"). The storage regions 6 are also arrayed in rows in a second direction (Y-axis direction). Typically, the regions 6 have some geometric shape, for example a rectangular shape, and exhibit a width, W. The sum of the width, W, and the interval, I, are used in one example to define a cell pitch, CP. The cell pitch repeats in the X-axis direction.

The storage regions 6 in FIG. 1 are not all labeled but each square like those labeled with a 6 is a storage region. The storage regions 6 are typically charge storage regions that form parts of memory cells 100 where the memory cells 100 are shown schematically as dashed-line circles. For clarity in the drawings, only representative memory cells 100 are shown with a dashed-line circle; but whether shown with a dashed-line circle or not, in general there is one memory cell for each charge storage region.

References to storage regions 6, memory cells 100 and other elements in this specification are intended, when suggested by the context, to include reference to like-numbered elements augmented with a prime "'" (as in 6' and 100') or augmented with a hyphen "-" followed by a number (as in 6-2 and 100-1$_A$). References augmented with a prime "'" refer to inactive ("dummy") elements (as in dummy charge storage region 6').

The memory device 1 includes conductor lines in the form of bit lines 5, including bit lines 5-1, 5-2, 5-3, 5-5, 5-6 and so on extending in one direction (Y-axis direction) and spaced apart in another direction (X-axis direction). The memory device 1 includes additional conductor lines in the form of word lines 7, including word lines 7-1, 7-2, 7-3, 7-4 and so on extending in the X-axis direction and spaced apart in the Y-axis direction. In this specification, references to the bit lines 5 (see FIG. 1, FIG. 1A, FIG. 2A, FIG. 3, FIG. 5), 25 (see FIG. 1B, FIG. 2B), 105 (see FIG. 3) and 205 (see FIG. 3) including references to 5-, 25-, 105- and 205- (where the "-" is followed by a number) refer to bit lines and/or sources or drains of memory cells as the context suggests. In this specification, the bit lines 5, 25, 105 and 205 typically are diffusions that form, for each memory cell 100, a source or a drain (5-, 25-, 105- and 205-).

In FIG. 1, a first row of memory cells 100, including memory cells 100-1$_A$, 100-2$_A$, 100'-3$_A$, 100'-4$_A$, and 100-5$_A$ are show extending in the X-axis direction. The memory cells 100-1$_A$, 100-2$_A$, 100'-3$_A$, 100'-4$_A$, and 100-5$_A$ include the charge storage regions 6 including charge storage regions 6-1, 6-2, 6'-3, 6'-4 and 6-5, respectively.

In FIG. 1, the memory device 1 includes a first array region 101 of a group of memory cells 100, one memory cell for each charge storage region 6. The group of memory cells 100 in the array region 101 are intersected by the bit lines 5-1 and 5-2; including generically memory cells 100 and specifically including memory cell 100-1$_A$ and memory cell 100-2$_A$ by way of example. These memory cells 100 in array region 101 are a first group of memory cells 100. The memory cells 100 of that first group in array region 101 are intersected by the word lines 7-1, 7-2, 7-3, 7-4. The memory device 1 includes a second array region 102 including a second group of memory cells 100 where the memory cells 100 of the second group are intersected by the bit lines 5-5 and 5-6 and by the word lines 7-1, 7-2, 7-3, 7-4. The memory cells in the second array region 102 include memory cells 100-5$_A$ and 100 juxtaposed word lines 7-3 and 7-4, respectfully, by way of example. These memory cells 100 intersected by the bit lines 5-5 and 5-6 are a second group of memory cells 100. The memory device 1 includes a third region, isolation region 103, including a group of memory cells 100 between the bit lines 5-3 and 5-5 and intersected by the word lines 7-1, 7-2, 7-3, 7-4; including memory cell 100' juxtaposed word line 7-1, including memory cell 100' juxtaposed word line 7-2, and including memory cells 100'-3$_A$ and 100'-4$_A$ juxtaposed word line 7-3 by way of example. The memory cells 100 between the bit lines 5-3 and 5-5 are a third group of memory cells 100. The third group of memory cells 100 are dummy memory cells, designated as such by the prime (') in 100'. The isolation region 103 includes the isolation 8. The isolation region 103 is a "dummy cell" region between the first array region 101 and the second array region 102. The charge storage regions 6 in the "dummy cell" region 103 are dummy charge storage regions designated as such by the prime (') in 6'. The dummy memory cells 100' and the dummy charge storage regions 6' do not store logical states (such as logical "1" or logical "0") but are provided to help maintain the repeating accuracy of the cell pitch in the memory device 1 and otherwise to assist in establishing and maintaining the structure of the memory device 1.

Figure 1A:
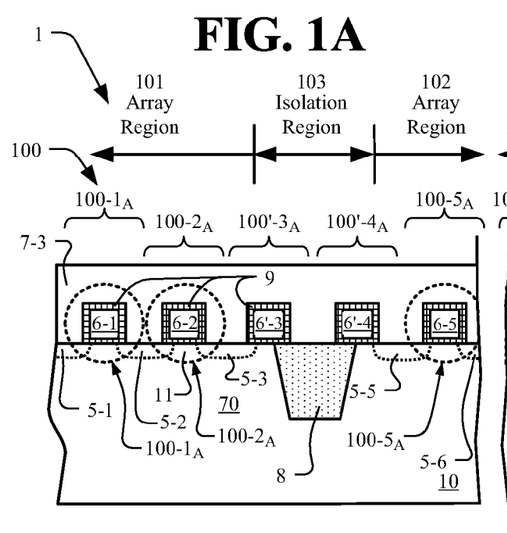
FIG. 1A depicts a cross-sectional view of the memory device of FIG. 1.

FIG. 1A depicts a cross-sectional view along the section line A-A' of FIG. 1. In FIG. 1A, a plurality of memory cells 100 (for example, memory cells 100-1$_A$, 100-2$_A$, 100'-3$_A$, 100'-4$_A$ and 100-5$_A$) are shown. By way of example, memory cell 100-1$_A$ has a charge storage region 6-1 (CSR1), a word-line (WL) 7-3, and two source/drain diffusions 5-1 and 5-2 (also designated as bit-line diffusions BL1 and BL2). The memory cells 100-1$_A$ and 100-2$_A$ are part of a group of memory cells in array region 101. By way of further example, memory cell 100-5$_A$ has a charge storage region 6-5, a word-line (WL) 7-3, and two diffusions 5-5 and 5-6 (bit-line diffusions). The memory cell 100-5$_A$ is part of a group of memory cells in array region 102.

The memory cells 100 in array region 101, including memory cell 100-1$_A$ and 100-2$_A$, are isolated by the isolation region 103 from the memory cells 100 in array region 102. The array region 102 includes the memory cell 100-5$_A$. The isolation region 103 typically employs an isolation 8 (such as formed by Shallow-Trench Isolation, STI, or LOCal Oxidation of Silicon, LOCOS) to separate memory cells 100 in array region 101 from the memory cells 100 in array region 102. The isolation region 103 can be arranged in any place in the array of memory device 1, including central regions and the edges. Typically, the isolation region 103 does not include active memory cells. In addition to being used for isolation between the memory cells 100 in array region 101 and array region 102, the isolation region 103 optionally is further used as a region to provide electrical coupling between metal layers (see FIG. 3 and FIG. 5) and word lines 7.

Referring to FIG. 1 and FIG. 1A, the isolation region 103 includes dummy charge storage regions 6', including dummy charge storage regions 6'-3 and 6'-4 for word line 7-3 by way of example, to ensure accurate patterning during manufacturing steps. The active charge storage regions 6 by way of example for word line 7-3 are charge storage regions 6-1, 6-2 and 6-5 of active memory cells 100-1$_A$, 100-2$_A$ and 100-5$_A$. Typically, the dummy charge storage regions 6' are arranged in a repetitive pattern at the cell pitch together with the active charge storage regions 6 of active memory cells 100. Thus, charge storage regions 6, including charge storage regions 6 of active memory cells 100 and charge storage regions 6' of inactive (dummy) memory cells 100', are arranged in repetitive patterns at the cell pitch through out a region of or through out the entire array of the memory device 1.

In the embodiment as shown in FIG. 1 and FIG. 1A, the cell pitch, defined as the spacing of adjacent charge storage regions 6 and dummy charge storage regions 6', is kept substantially equal. For example, for a given manufacturing process having a feature size "F" (for example, 40 nm) as the smallest feature size, the dummy charge storage regions 6' have a cell pitch of two times F (2 F) if the cell pitch for charge storage regions 6 of active memory cells 100, such as memory cells 100-1$_A$ and 100-2$_A$, is about 2 F.

In another embodiment (not shown), the cell pitch between dummy charge storage regions 6' is kept at a larger cell pitch (for example, 3 F, 4 F etc) than the cell pitch for the active charge storage regions 6. In FIG. 1 and FIG. 1A, two dummy charge storage regions 6'-3 and 6'-4 are provided in the isolation region 103. Generally, any number of dummy charge storage regions 6' can be arranged in the isolation region 103 to ensure that the active charge storage regions 6 of memory cells 100 are properly patterned.

In FIG. 1A, the memory device 1 includes a body 70 including a number of memory cells, for example memory cells 100-1$_A$, 100-2$_A$, 100'-3$_A$, 100'-4$_A$ and 100-5$_A$. Memory cell 100-2$_A$ is described as typical. Memory cell 100-2$_A$ includes a source 5-2, a channel 11, and a drain 5-3 in body 70 of semiconductor substrate 10. Substrate 10 is typically a silicon substrate or a silicon-on-insulator substrate. The body 70 comprises a semiconductor material of a first conductivity type (for example, p-type) having a doping level in the range from about $1 \times 10^{15}$ atoms/cm$^3$ to about $1 \times 10^{18}$ atoms/cm$^3$. The source 5-2 and drain 5-3 are arranged in the body 70, with the channel 11 of the body 70 defined there between, and are typically heavily doped by impurity of a second conductivity type (for example, n-type) having a doping level in the range from about $1 \times 10^{18}$ atoms/cm$^3$ to about $5 \times 10^{21}$ atoms/cm$^3$. These doping regions may be arranged by thermal diffusion or by ion implantation. In this specification, source and drain regions 5, such as the source 5-2 and drain 5-3 regions, are interchangeable and hence, in general, any reference to a "source" can be interchanged with reference to a "drain" and vice versa. Because of this inter-changeability, a source or a drain region is referred to as a source/drain region, a drain/source region, a first region or a second region as appropriate in the context. The charge storage region 6-2 juxtaposed the channel 11 has a width in the X-axis direction that is somewhat longer than the width of the channel 11 in the X-axis direction so that the charge storage region 6-2 projects over end portions of the source 5-2 and the drain 5-3.

In FIG. 1A, the charge storage regions 6 and 6' include charge storage regions 6-1, 6-2, 6'-3, 6'-4 and 6-5. Each of the charge storage regions 6 and 6' is encapsulated by a dielectric 9. The isolation 8 extends into the substrate 10 between and extending well below the depths of the source/drains 5-3 and 5-5. The dummy charge storage regions 6'-3 and 6'-4 are juxtaposed the isolation 8 and do not function to store any logical state. The charge storage regions 6-1, 6-2 and 6-5 are active charge storage regions. The charge storage regions 6-1 and 6-2 are in the array region 101 and the charge storage region 6-5 is in the array region 102. The array region 101 and the array region 102 are isolated by the isolation region 103 including the dummy charge storage regions 6'-3 and 6'-4 and the isolation 8. The word line 7-3 is juxtaposed all the charge storage regions 6-1, 6-2, 6'-3, 6'-4 and 6-5.

Figure 1B:
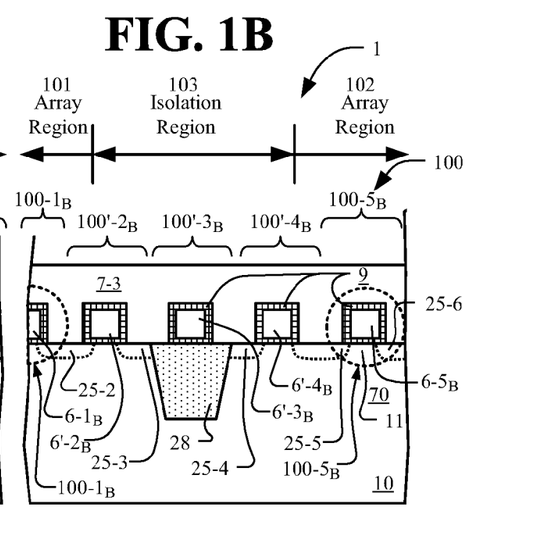
FIG. 1B depicts a cross-sectional view of alternate embodiment of the FIG. 1 and FIG. 1A memory device.

FIG. 1B shows an alternate embodiment for the memory device 1 of FIG. 1A having a different design for isolation region 103 and the dummy charge storage regions 6', including dummy charge storage regions 6'-2$_B$, 6'-3$_B$ and 6'-4$_B$. In FIG. 1B, a cross-sectional view along a section line analogous to section line A-A' of FIG. 1 is shown where the isolation 8 is replaced with the alternate isolation 28 between alternate bit lines 25-3 and 25-4 shown within an oval with dot-dash lines in FIG. 1. In FIG. 1B, a plurality of memory cells 100 (including memory cells 100-1$_B$, 100'-2$_B$, 100'-3$_B$, 100'-4$_B$, and 100-5$_B$) are shown. Memory cell 100-5$_B$ is described by way of example. Memory cell 100-5$_B$ has a charge storage region 6-5$_B$, a word-line 7-3, and two bit line diffusions 25-5 and 25-6. The memory cells 100 in array region 101 of FIG. 1B are part of a group including memory cell 100-1$_B$ and the memory cells 100 in array region 102 are part of a group including memory cell 100-5$_B$. The memory cells 100 in array region 101 and region 102 are isolated by the isolation region 103 of FIG. 1B. The isolation region 103 typically employs an isolation 28 (such as a Shallow-Trench Isolation, STI) to separate the memory cells 100 in array region 101 from the memory cells 100 in array region 102. The isolation region 103 can be located at any place, including the central portion and the edges of, memory device 1. Typically, the isolation region 103 does not include active memory cells. In addition to being used for isolation between the memory cells 100 in array region 101 and array region 102, the isolation region 103 optionally is further used as a region to provide electrical coupling between metal layers (see FIG. 3 and FIG. 5) and word lines 7.

In FIG. 1B, the isolation region 103 includes dummy charge storage regions 6', including dummy charge storage regions 6'-2$_B$, 6'-3$_B$ and 6'-4$_B$ to ensure the proper patterning during manufacturing steps of active charge storage regions 6, for example charge storage regions 6-1$_B$ and 6-5$_B$ of active memory cells 100-1$_B$ and 100-5$_B$. Typically, the dummy charge storage regions 6' are arranged in a repetitive pattern along with the charge storage regions 6 of active memory cells 100. Thus, charge storage regions, including charge storage regions 6 of active cells 100 and charge storage regions 6' of dummy memory cells 100', as a whole are arranged in repetitive patterns through out a region of or through out the entire array of the memory device 1.

In one embodiment as shown in FIG. 1 and FIG. 1B, the cell pitch, defined as the spacing of adjacent charge storage regions 6 or dummy charge storage regions 6', is kept substantially equal. For example, for a given manufacturing process having a feature size "F" (for example, 40 nm) as the smallest feature size, the dummy charge storage regions 6' have a cell pitch of two times F (2 F) if the cell pitch for charge storage regions 6 of active memory cells, such as memory cells 100-1$_B$ and 100-5$_B$, is about 2 F.

In an alternate embodiment (not shown) to that of FIG. 1B, the cell pitch between dummy charge storage regions 6' is kept at a larger cell pitch (for example, 3 F, 4 F etc) than the cell pitch for the charge storage regions 6. In FIG. 1B, three dummy cells 6'-2, 6'-3 and 6'-4 are provided in the isolation region 103. Generally, any numbers of dummy charge storage regions 6' can be arranged in the isolation region 103.

In FIG. 1B, the memory device 1 includes a body 70 including a number of memory cells, for example memory cells 100-1$_B$ and 100-5$_B$. Memory cell 100-5$_B$ is described as typical. Memory cell 100-5$_B$ includes a source 25-5, a channel 11, and a drain 25-6 in semiconductor substrate 10 (such as a silicon substrate or a silicon-on-insulator substrate). The body 70 comprises a semiconductor material of a first conductivity type (for example, p-type) having a doping level in the range from about $1 \times 10^{15}$ atoms/cm$^3$ to about $1 \times 10^{18}$ atoms/cm$^3$. The source 25-5 and drain 25-6 are arranged in the body 70 with the channel 11 of the body 70 defined there between, and are typically heavily doped by impurity of a second conductivity type (for example, n-type) having doping level in the range of about $1 \times 10^{18}$ atoms/cm$^3$ to about $5 \times 10^{21}$ atoms/cm$^3$. These doping regions may be arranged by thermal diffusion or by ion implantation. In this specification, the source 25-5 and drain 25-6 regions are interchangeable and hence any reference to a "source" can be interchanged with reference to a "drain" and vice versa. Because of this interchangeability, a source or a drain region is referred to as a source/drain region, a drain/source region, a first region or a second region as appropriate in the context. The charge storage region 6-5$_B$ juxtaposed the channel 11 has a width in the X-axis direction that is somewhat longer than the width of the channel 11 in the X-axis direction so that the charge storage region 6-5$_B$ projects over end portions of the source 25-5 and the drain 25-6.

In FIG. 1B, the charge storage regions 6 and 6' include charge storage regions 6-1$_B$, 6'-2, 6'-4$_B$ and 6-5$_B$. Each of the charge storage regions 6 and 6' is encapsulated by a dielectric 9. The isolation 28 extends into the substrate 10 between portions of and extending well below the depths of the source/ drains 25-3 and 25-4. The dummy charge storage regions 6'-2$_B$, 6'-3$_B$ and 6'-4$_B$ are juxtaposed the isolation 28 and do not function to store any logical state. The charge storage regions 6-1$_B$ and 6-5$_B$ are active charge storage regions. The charge storage region 6-1$_B$ is in the array region 101 and the charge storage region 6-5$_B$ is in the array region 102. The array region 101 and the array region 102 are isolated by the isolation region 103 including the dummy charge storage regions 6'-2$_B$, 6'-3$_B$ and 6'-4$_B$ and the isolation 28. The word line 7-3 is juxtaposed all the charge storage regions 6-1$_B$, 6'-2$_B$, 6'-3$_B$, 6'-4$_B$ and 6-5$_B$.

Figure 2A:
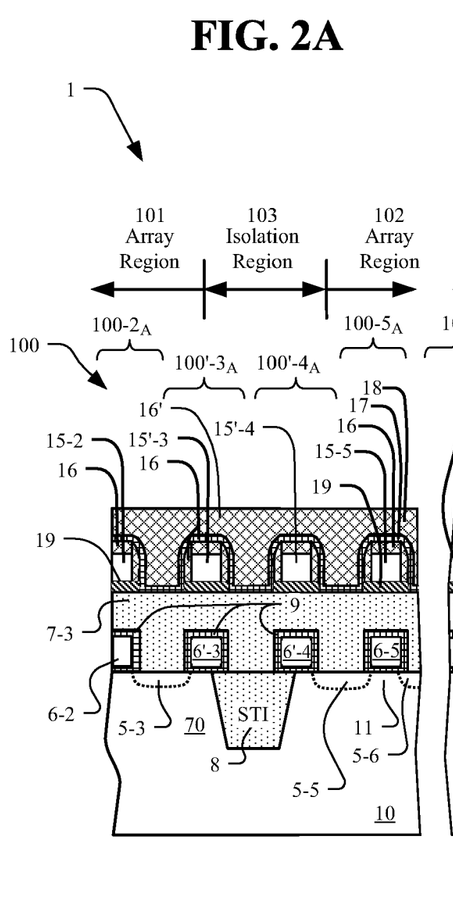
FIG. 2A and FIG. 2B depict an array of cells for the memory devices of FIG. 1A and FIG. 1B, respectively, wherein each cell further includes a filter, a tunneling-gate and stacked layers of dielectrics.
Figure 2B:
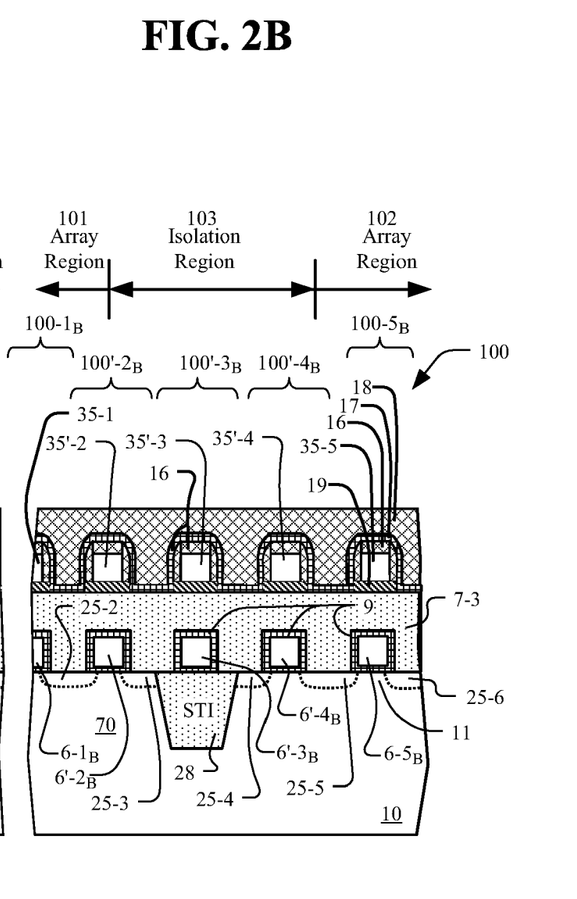

FIG. 2A and FIG. 2B depict an array of memory cells for the embodiments of FIG. 1A and FIG. 1B, respectively, wherein each memory cell further includes a filter 19, a tunneling-gate 15 and stacked layers of dielectrics (such as nitride and oxide) 16, 17 and 18. In FIG. 2A, the memory cells 100-2$_A$ and 100-5$_A$ are active memory cells and the dummy memory cells 100'-3$_A$ and 100'-4$_A$ are inactive memory cells. In FIG. 2B, the memory cells 100-1$_B$ and 100-5$_B$ are active and the dummy memory cells 100'-2$_B$, 100'-3$_B$ and 100'-4$_B$ are inactive.

In FIG. 2A, the charge storage regions 6 and 6' include charge storage regions 6-2, 6'-3, 6'-4 and 6-5 for the memory cells 100-2$_A$, 100'-3$_A$, 100'-4$_A$ and 100-5$_A$. Each of the charge storage regions 6 and 6' is encapsulated by a dielectric 9. The isolation 8 extends into the substrate 10 between and extending well below the depths of the source/drains 5-3 and 5-5. The dummy charge storage regions 6'-3 and 6'-4 are juxtaposed the isolation 8 and do not function to store any logical state. The charge storage regions 6-2 and 6-5 are active charge storage regions in that they are capable of storing logical states. The charge storage region 6-2 is in the array region 101 and the charge storage region 6-5 is in the array region 102. The array region 101 and the array region 102 are isolated by the isolation region 103 including the dummy charge storage regions 6'-3 and 6'-4 and the isolation 8. The word line 7-3 is juxtaposed all the charge storage regions 6-2, 6'-3, 6'-4 and 6-5.

In FIG. 2A, a plurality of tunneling gates 15 and filters 19 are shown juxtaposed the word line 7-3 and in alignment with the charge storage regions 6. Specifically, the tunneling gates 15 include active tunneling gates 15-2 and 15-5 and dummy tunneling gates 15'-3 and 15'-4 aligned with the charge storage regions 6-2 and 6-5 and dummy charge storage regions 6'-3 and 6'-4, respectively. Each of the tunneling gates 15 and 15' includes a filter 19 juxtaposed the word line 7-3. The tunneling gates 15 and 15' above the filters 19 are surrounded by an insulator 16 such as a nitride. The tunneling gates 15 and 15', filters 19 and surrounding insulator 16 are further covered by an oxide 17 also extending to and juxtaposed the word line 7-3 between the tunneling gates 15 and 15'. A nitride 18 is juxtaposed the oxide 17.

In FIG. 2A, the memory cell 100-5$_A$ is described as typical. Memory cell 100-5$_A$ has a charge storage region 6-5, a word-line 7-3, and two bit line diffusions 5-5 and 5-6 forming a source and a drain. A channel 11 is between the source and the drain 5-5 and 5-6. Aligned with charge storage region 6-5 and juxtaposed the word line 7-3 is the filter 19, tunneling gate 15-5, nitride 16, oxide 17 and nitride 18.

In FIG. 2B, the charge storage regions 6 and 6' include charge storage regions 6-1$_B$, 6'-2$_B$, 6'-4$_B$ and 6-5$_B$ associated with the memory cells 100-1$_B$, 100'-2$_B$, 100'-3$_B$, 100'-4$_B$, and 100-5$_B$, respectively.

Each of the charge storage regions 6 and 6' is encapsulated by a dielectric 9. The isolation 28 extends into the substrate 10 between and extending well below the depths of the source/drains 25-3 and 25-4. The dummy charge storage regions 6'-2$_B$, 6'-3$_B$ and 6'-4$_B$ are juxtaposed the isolation 28 and do not function to store any logical state. The charge storage regions 6-1$_B$ and 6-5$_B$ are active charge storage regions for storing logical states. The charge storage region 6-1$_B$ is in the array region 101 and the charge storage region 6-5$_B$ is in the array region 102. The array region 101 and the array region 102 are isolated by the isolation region 103 including the dummy charge storage regions 6'-2$_B$, 6'-3$_B$ and 6'-4$_B$ and the isolation 28. The word line (WL) 7-3 is juxtaposed all the charge storage regions 6-1$_B$, 6'-2$_B$, 6'-3$_B$, 6'-4$_B$ and 6-5$_B$.

In FIG. 2B, a plurality of tunneling gates 35 and filters 19 are shown juxtaposed the word line 7-3 and in alignment with the charge storage regions 6. Specifically, the tunneling gates include active tunneling gates 35-1 and 35-5 and dummy tunneling gates 35'-2, 35'-3 and 35'-4 aligned with the active charge storage regions 6-1$_B$ and 6-5$_B$ and dummy charge storage regions 6'-2$_B$, 6'-3$_B$ and 6'-4$_B$, respectively. Each of the tunneling gates 35 and 35' is juxtaposed a filter 19 which in turn is juxtaposed the word line 7-3. The tunneling gates 35 and 35' juxtaposed (above) the filters 19 are surrounded by an insulator 16 such as a nitride. The tunneling gates 35 and 35', filters 19 and surrounding insulator 16 are further covered by an oxide 17 also extending to and juxtaposed the word line 7-3 between the tunneling gates 35 and 35'. A nitride 18 is juxtaposed the oxide 17.

In FIG. 2B, the memory cell 100-5$_B$ is described as typical. Memory cell 100-5$_B$ has a charge storage region 6-5$_B$, a word-line (WL) 7-3, and two bit line diffusions 25-5 and 25-6 forming a source and a drain. A channel 11 is between the source and drain 25-5 and 25-6. Aligned with charge storage region 6-5$_B$ and juxtaposed the word line 7-3 is the filter 19, tunneling gate 35-5, nitride 16, oxide 17 and nitride 18.

In FIG. 2A and FIG. 2B, three insulating layers 16, 17 and 18 are shown by way of example in the embodiments described. In alternative embodiments, only one or two of the three insulating layers 16, 17 and 18 are employed. Therefore, such alternate embodiments (not shown) are constructed with one or two of any ones of the three insulating layers 16, 17 and 18.

Figure 3:
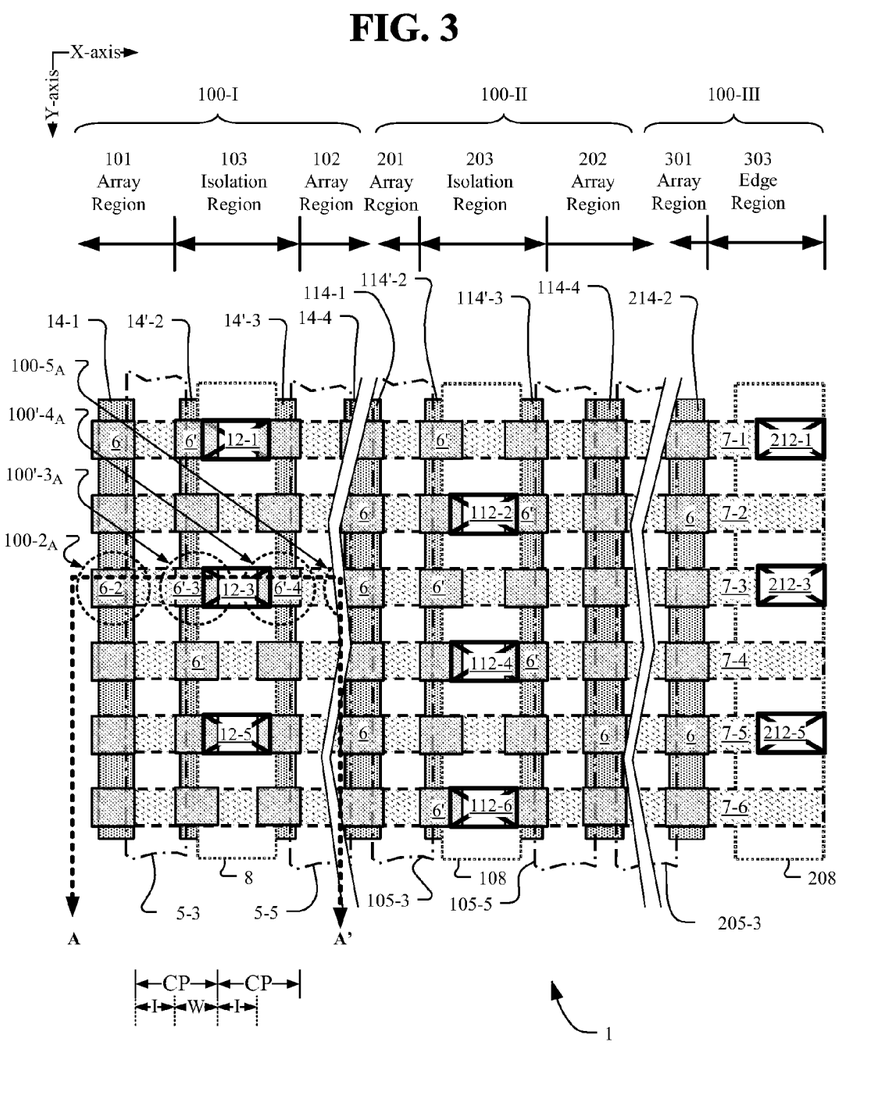
FIG. 3 depicts a top view of a memory device utilizing arrays of cells of the FIG. 2A type.

FIG. 3 depicts a top view of a memory device 1 which includes part of an array formed by memory cells 100 (including memory cells 100-2$_A$ and 100-5$_A$) together with dummy cells 100' (including dummy memory cells 100'-3$_A$ and 100'-4$_A$) of the FIG. 1A type. The memory device 1 of the FIG. 3 example is readily modified to alternatively utilize the memory cells 100 (including the memory cells 100-1$_B$, 100-2$_B$ and 100-5$_B$) together with dummy cells 100' (including dummy memory cells 100'-2$_B$, 100'-3$_B$ and 100'-4$_B$) of the FIG. 1B type. The memory device 1 of the FIG. 3 example is readily modified to alternatively utilize the memory cells 100 and 100' (including memory cells 100-2$_A$, 100'-3$_A$, 100'-4$_A$, 100-5$_A$) of the FIG. 2A type. The memory device 1 of the FIG. 3 example is readily modified to alternatively utilize the memory cells 100 and 100' (including memory cells 100-1$_B$, 100'-2$_B$, 100'-3$_B$, 100'-4$_B$ and 100-5$_B$) of the FIG. 2B type.

In FIG. 3, the memory device 1 includes three groups of regions 100-I, 100-II and 100-III. The first group 100-I includes array region 101, isolation region 103 and array region 102 corresponding to the like-numbered regions in FIG. 1, FIG. 1A and FIG. 2A. The second group 100-II includes array region 201, isolation region 203 and array region 202 analogous to the array region 101, isolation region 103 and array region 102, respectively. The third group 100-III includes an array region 301 analogous to the array region 101 and includes an edge region 303 having isolation similar to isolation region 103.

In FIG. 3 in each of the groups 100-I, 100-II and 100-III, the memory device 1 includes a plurality of charge storage regions 6 (including active regions 6 and dummy regions 6') where such charge storage regions 6 are arrayed in a first direction (X-axis direction) with intervals, I, between and separating the charge storage regions 6. Each charge storage region is capable of storing different logical states (for example, a logical "1" or a logical "0"). The charge storage regions 6 are also arrayed in rows a second direction (Y-axis direction). The charge storage regions 6 have some geometric shape, for example a rectangular shape, and exhibit a width, W. The sum of the width, W, and the interval, I, are used in one example to define a cell pitch, CP. The cell pitch repeats in the X-axis direction. The charge storage regions 6 are parts of memory cells 100 (including memory cells 100 and 100'), one memory cell 100 for each charge storage region 6 (including charge storage regions 6 and 6').

In FIG. 3 in each of the groups 100-I, 100-II and 100-III, the memory device 1 includes conductor lines in the form of bit lines 5 in group 100-I, bit lines 105 in group 100-II and bit lines 205 in group 100-III. For the regions 101, 102 and 103, the bit lines 5-3 and 5-5 extend in one direction (Y-axis direction) and are spaced apart in another direction (X-axis direction). The isolation 8 extends in the Y-axis direction in region 103 between array regions 101 and 102. For the regions 201, 202 and 203, the bit lines 105-3 and 105-5 extend in one direction (Y-axis direction) and are spaced apart in another direction (X-axis direction). The isolation 108 extends in the Y-axis direction in region 203 between array regions 201 and 202. For the regions 301 and 303, the bit line 205-3 extends in one direction (Y-axis direction) and is spaced apart in another direction (X-axis direction) from other bit lines (not shown). The isolation 208 extends in the Y-axis direction in the edge region 303.

In FIG. 3 in each of the groups 100-I, 100-II and 100-III, the memory device 1 includes additional conductor lines in the form of word lines 7, including word lines 7-1, 7-2, 7-3, 7-4, 7-5 and 7-6 and so on extending in the X-axis direction and spaced apart in the Y-axis direction.

In FIG. 3 in the first group 100-I, in the regions 101, 102 and 103, the memory device 1 includes contacts 12 including the contact 12-1 for word line 7-1, contact 12-3 for word line 7-3 and contact 12-5 for word line 7-5. The memory device 1 includes tunneling lines 14 (TL) including the active tunneling line 14-1, the dummy tunneling line 14'-2, the dummy tunneling line 14'-3 and active tunneling line 14-4. The tunneling lines 14 are oriented in the first direction (Y-axis direction) and are spaced apart in another direction (X-axis direction). In the second group 100-II, in the regions 201, 202 and 203, the memory device 1 includes contacts 12 including the contact 112-2 for word line 7-2, contact 112-4 for word line 7-4 and contact 112-6 for word line 7-6. The memory device 1 includes tunneling lines 114 (TL) including the active tunneling line 114-1, the dummy tunneling line 114'-2, the dummy tunneling line 114'-3 and active tunneling line 114-4. The tunneling lines 114 are oriented in the first direction (Y-axis direction) and are spaced apart in another direction (X-axis direction). In the third group 100-III, in the regions 301 and 303, the memory device 1 includes contacts 12 including the contact 212-1 for word line 7-1, contact 212-3 for word line 7-3 and contact 212-5 for word line 7-5. The memory device 1 includes tunneling lines 214 (TL) including the active tunneling line 214-2 oriented in the first direction (Y-axis direction) and spaced apart in another direction (X-axis direction) with other tunneling lines 214 (not shown). The tunneling lines 14, 114 and 214 interconnect a plurality of tunneling gates (such as gates 15 and 15' in FIG. 2A) in the same column (Y-axis direction). The tunneling lines 14'-2, 14'-3 and 114'-2, 114'-3 in the isolation regions 103 and 203 are termed as the dummy tunneling lines.

In FIG. 3, the isolations 8, 108 and 208 are located in the central portions of the array (isolations 8 and 108) and at the edge of the array (isolation 208). The contacts 12, 112 and 212 connect to word lines 7 in a staggered manner so that contacts in adjacent word lines are not adjacent. For example, contact 12-1 in word line 7-1 is not aligned in the Y-axis direction with any contact in word line 7-2. Each of the contacts 12-1, 12-3 and 12-5 aligned in the Y-axis direction appear in alternate (and not adjacent) word lines 7-1, 7-3 and 7-5.

Figure 4A:
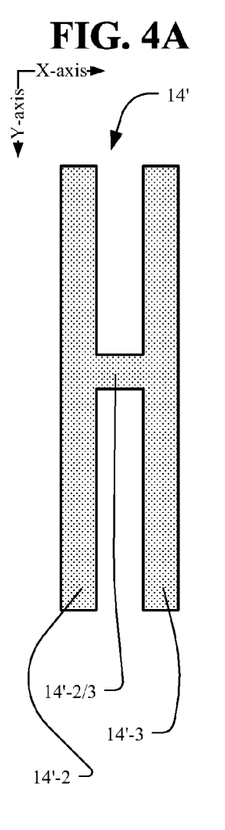
FIG. 4A, FIG. 4B and FIG. 4C depict alternate embodiments of tunneling lines for use with the memory device of FIG. 3 or other memory devices.
Figure 4B:
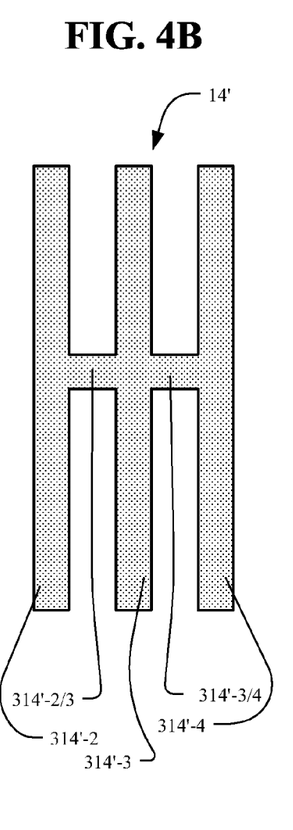
Figure 4C:
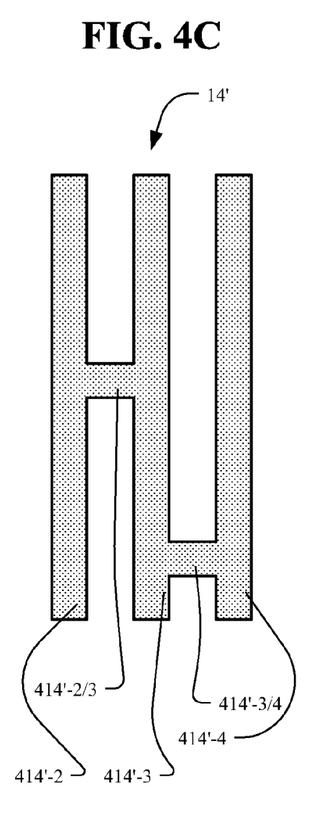

FIG. 4A, FIG. 4B and FIG. 4C depict alternate embodiments of dummy tunneling lines 14' for use with the memory device 1 of FIG. 3 or other memory devices. In FIG. 4A, the two tunneling lines 14'-2 and 14'-3 of FIG. 3, extending in the Y-axis direction, are modified in FIG. 4 to have a layout pattern in the shape of the letter "H" by inclusion of a cross connection 14'-2/3 extending in the X-axis direction and connecting the two tunneling lines 14'-2 and 14'-3. The inclusion of a cross connection between dummy tunneling lines can be employed in any convenient geometry such as shown in FIG. 4B and FIG. 4C, for example.

In FIG. 4B, the three tunneling lines 314'-2, 314'-3 and 314'-4, extending in the Y-axis direction, have a layout pattern in the shape of the letters "H" by inclusion of cross connections 314'-2/3 extending in the X-axis direction and connecting the two tunneling lines 314'-2 and 314'-3 and inclusion of cross connections 314'-3/4 extending in the X-axis direction and connecting the two tunneling lines 314'-3 and 314'-4. The embodiment of FIG. 4B can be used, for example, with the embodiment of FIG. 2B which includes three adjacent tunneling gates 35'-2, 35'-3 and 35'-4 connected by the tunneling lines 314'-2, 314'-3 and 314'-4, respectively.

In FIG. 4C, two horizontal (X-axis) tunneling lines 414'-2/3 and 414'-3/4 are not aligned together and are offset by a distance in the Y-axis direction.

All of the embodiments in FIG. 4A, FIG. 4B, and FIG. 4C provide the advantage on strengthening the dummy tunneling line formation. Such strengthening is desirable for lines with geometry in the nano meter (nm) scale.

Figure 5:
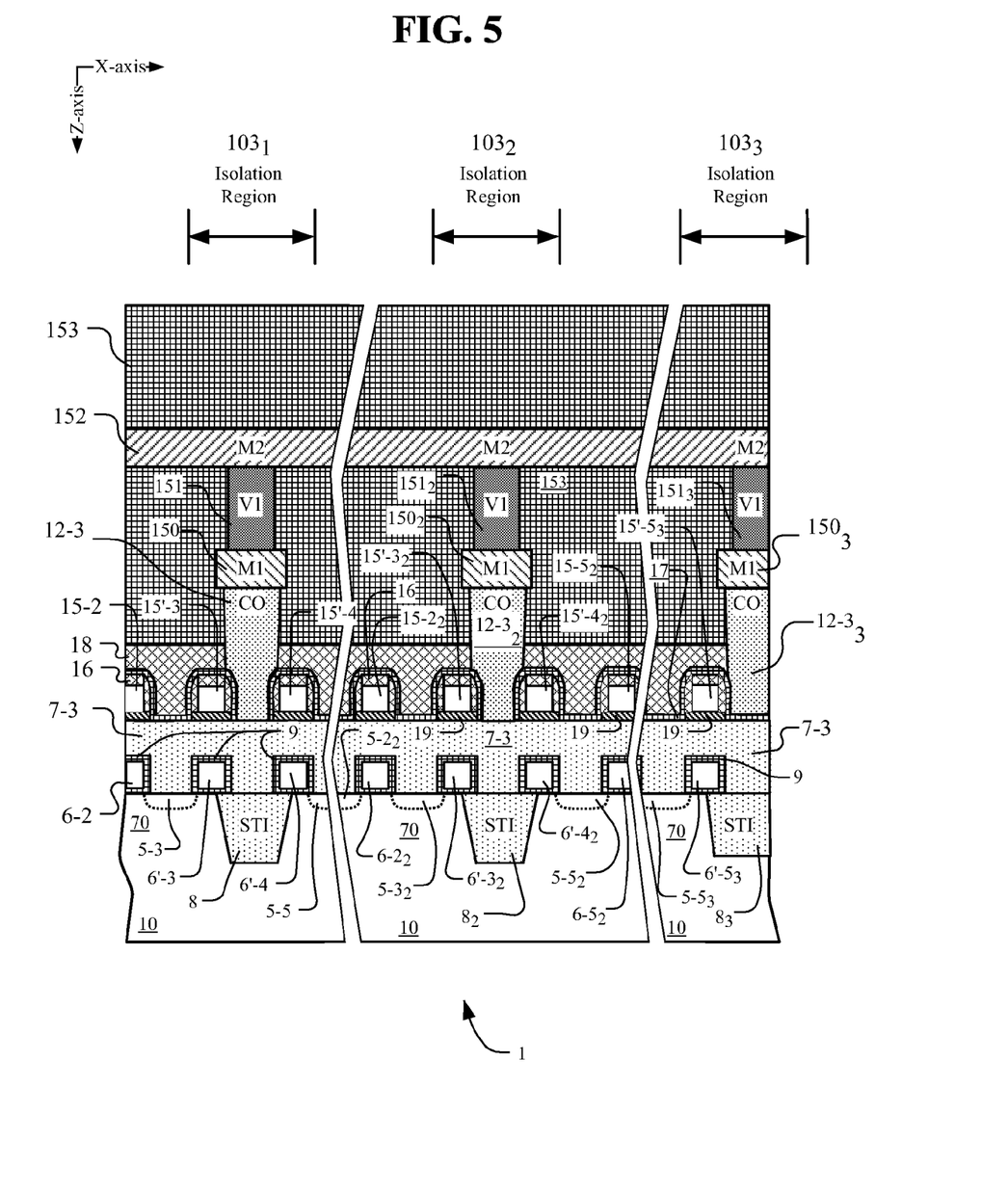
FIG. 5 provides a cross-sectional view of a portion of the memory device of FIG. 3.

FIG. 5 provides a cross-sectional view of a memory device 1 of the FIG. 3 type patterned on a view along the section line A-A' of FIG. 3. The portion of FIG. 3 along the section line A-A' is shown in that portion of FIG. 5 in the region of the isolation region $103_1$ in FIG. 5. Similar cross sectional views are repeated in FIG. 5 to show an analogous isolation region $103_2$ and an analogous isolation region $103_3$. The isolation region $103_2$ and isolation region $103_3$ depict regions of the semiconductor device 1 of FIG. 3 when FIG. 3 is expanded to reveal more memory cells 100 in the X-axis direction in the group 100-I region and then viewed to show contacts $12-3_2$ and $12-3_3$ connecting to word line 7-3 where contacts $12-3_2$ and $12-3_3$ are not explicitly shown in FIG. 3. The contacts 12-3, $12-3_2$ and $12-3_3$ are shown in FIG. 5 with each contact connected at one end to an M1 metal 150, including metal 150, $150_2$ and $150_3$, respectively, and at the other end to the word line 7-3. Each M1 metal 150 is shown connected to a common M2 metal 152 through a conductive via (V1) 151, including via 151, $151_2$ and $151_3$, respectively. In other embodiments, each M1 metal can be separately connected to a separate M2 metal (rather than the common M2 metal shown).

In FIG. 5, the charge storage regions 6 and 6' include charge storage regions 6-2, 6'-3, 6'-4 in or in proximity to the isolation region $103_1$; include charge storage regions $6-2_2$, $6'-3_2$, $6'4_2$, $6-5_2$ in or in proximity to the isolation region $103_2$; and include charge storage region $6'-5_3$ in the isolation region $103_3$. Each of the charge storage regions 6 and 6' is encapsulated by a dielectric 9. The isolations 8, $8_2$ and $8_3$ extend into the substrate 10 between and extending well below the depths of the source/drains 5-3 and 5-5; the source/drains $5-2_2$, $5-3_2$ and $5-5_2$ and the source/drain $5-5_3$. The charge storage regions 6'-3, 6'-4; $6'-3_2$, $6'-4_2$ and $6'-5_3$ are indicated as dummy by inclusion of a prime ('). The dummy charge storage regions 6' are juxtaposed the isolations 8, $8_2$ and $8_3$ and do not function to store any logical state. The charge storage regions 6-2; $6-2_2$ and $6-5_2$ are active charge storage regions for storing logical states.

In FIG. 5, a plurality of tunneling gates are shown including tunneling gates 15-2, 15'-3 and 15'-4 in or in proximity to the isolation region $103_1$; tunneling gates $15-2_2$, $15'-3_2$, $15'-4_2$ and $15-5_2$ in or in proximity to the isolation region $103_2$; and tunneling gate $15-5_3$ in the isolation region $103_3$. The filters 19 are juxtaposed the word line 7-3 and the charge storage regions 6 and 6'. The tunneling gates 15 and 15' are juxtaposed (above) the filter 19 and are surrounded by an insulator 16 such as a nitride. The tunneling gates 15 and 15' and filters 19 and the surrounding insulator 16 are further covered by an oxide 17 also extending to and juxtaposed the word line 7-3 between the tunneling gates 15 and 15'. A nitride 18 is juxtaposed the oxide 17. In alternate embodiments, any one or two of the insulators including nitride 16, oxide 17 and nitride 18 can be employed.

In FIG. 5, contact 12-3 between the dummy tunneling gates 15'-3 and 15'-4 contacts the M1 metal 150. Similarly, contact $12-3_2$ between the dummy tunneling gates $15'-3_2$ and $15'-4_2$ contacts the M1 metal $150_2$ and the contact $12-3_3$ juxtaposed the dummy tunneling gate $15'-5_3$ contacts the M1 metal $150_3$. The M1 metal 150, the M1 metal $150_2$ and the M1 metal $150_3$ connect through conductors in the form of vias 151, $151_2$ and $151_3$, respectively, to the M2 metal 152. An insulator 153 surrounds the contacts 12-3, $12-3_2$, $12-3_3$; the M1 metal 150, $150_2$, and $150_3$; and the M2 metal 152.

Embodiments of the specification include a method of arranging a memory device comprising arranging a plurality of storage regions arranged with storage region intervals, arranging a plurality of conductor lines, and arranging one or more isolations, each isolation adjacent one or more conductor lines and juxtaposed one or more of the storage regions that are dummy storage regions.

While the invention has been particularly shown and described with reference to preferred embodiments thereof it will be understood by those skilled in the art that various changes in arrangement and details may be made therein without departing from the scope of the invention.

What is claimed is:

1. A memory device, comprising:
   a plurality of storage regions arranged with storage region intervals,
   a plurality of conductor lines, and
   one or more isolations, each isolation adjacent one or more conductor lines and juxtaposed one or more of the storage regions that are dummy storage regions,
   wherein the storage regions include tunneling gates, and wherein the conductor lines include i) a plurality of first tunneling lines for electrically coupling the tunneling gates and ii) dummy tunneling lines in proximity to the isolations.

2. The memory device of claim 1, wherein the storage regions are charge storage regions in memory cells, and wherein each memory cell further includes a first cell region, a second cell region, and a cell channel juxtaposed the charge storage region and located between the first cell region and the second cell region.

3. The memory device of claim 2, further including a first array region and a second array region separated by a first one of the isolations, each array region including one or more groups of the memory cells where each memory cell includes one of the storage regions.

4. The memory device of claim 2, wherein the conductor lines include first conductor lines extending in a first direction, and wherein the conductor lines further include second conductor lines extending in a second direction for electrically coupling the charge storage regions of a plurality of memory cells.

5. The memory device of claim 4, further including contacts electrically coupling the second conductor lines.

6. The memory device of claim 5, wherein each contact is juxtaposed an isolation and is located adjacent a dummy storage region.

7. The memory device of claim 5, wherein the contacts connect to metallization lines.

8. The memory device of claim 4, further including:
   a first contact electrically coupling a first one of the second conductor lines in proximity to a first isolation, and
   a second contact electrically coupling a second one of the second conductor lines in proximity to a second isolation.

9. The memory device of claim 1, wherein the isolation is an STI isolation or a LOCOS isolation.

10. The memory device of claim 1, wherein for one or more isolations, two or more of the dummy tunneling lines extend in a first direction and one or more connecting lines extend in a second direction and connect two of the dummy tunneling lines.

11. A memory device, comprising:
   a plurality of memory cells, each memory cell including a first cell region, a second cell region, a cell channel between the first cell region and the second cell region, and a charge storage region,
   a plurality of conductor lines,
   one or more groups of the memory cells and including for each memory cell in a group,
   a first one of the conductor lines aligned with the first cell region,
   a second one of the conductor lines aligned with the second cell region,
   the charge storage region juxtaposed a channel between the first one of the conductor lines and the second one of the conductor lines, and
   one or more isolation regions, each isolation region juxtaposed one or more charge storage regions for one or more memory cells, each isolation region adjacent one or more conductor lines and juxtaposed one or more of the storage regions that are dummy storage regions,
   wherein the memory cells include tunneling gates, and wherein the conductor lines include i) a plurality of first tunneling lines for electrically coupling the tunneling gates in array regions and ii) a plurality of second tunneling lines in the isolation regions.

12. The memory device of claim 11, wherein a second one of the conductor lines for memory cells in a first group is a first one of the conductor lines for memory cells in a second group.

13. The memory device of claim 11, wherein the one or more groups of the memory cells are arrayed in one or more of the array regions, wherein the array regions include a first array region and a second array region, and wherein one of the isolation regions separates the first array region and the second array region.

14. The memory device of claim 11, including for each memory cell a tunneling gate region in proximity to the charge storage region.

15. The memory device of claim 14, wherein the tunneling gate region includes a filter, a tunneling gate, and an insulator region.

16. The memory device of claim 11, wherein the first one of the conductor lines, the second one of the conductor lines, a third one of the conductor lines and a fourth one of the conductor lines are first conductor lines extending in a first direction, and wherein the memory device further includes second conductor lines extending in a second direction for electrically coupling the charge storage regions of the plurality of memory cells.

17. The memory device of claim 11, wherein the first one of the conductor lines and the second one of the conductor lines are first conductor lines extending in a first direction, and wherein the memory device further includes second conductor lines extending in a second direction through the array regions and through the isolation regions.

18. The memory device of claim 11, further including contacts electrically coupling second conductor lines in isolation regions.

19. The memory device of claim 11, wherein for one or more isolation regions, two or more of the second tunneling lines extend in a first direction and one or more connecting lines extend in a second direction and connect two or more of the second tunneling lines.

20. The memory device of claim 11, wherein each memory cell includes a tunneling gate region in proximity to the charge storage region.

21. The memory device of claim 11, wherein the first one of the conductor lines and the second one of the conductor lines are first conductor lines extending in a first direction, and wherein the memory device further includes second conductor lines extending in a second direction through the array regions and through the isolation regions.

22. The memory device of claim 11, further including:
   a first contact electrically coupling a first one of the second conductor lines in a first isolation region, and
   a second contact electrically coupling a second one of the second conductor lines in a second isolation region.

23. A method of arranging a memory device, the method comprising:
   arranging a plurality of memory cells, each memory cell including a first cell region, a second cell region, a cell channel between the first cell region and the second cell region, and a charge storage region,
   arranging a plurality of conductor lines,
   arranging one or more groups of the memory cells and including for each memory cell in a group,
   arranging a first one of the conductor lines connecting with the first cell region,
   arranging a second one of the conductor lines connecting with the second cell region,
   arranging the charge storage region juxtaposed the channel between the first one of the conductor lines and the second one of the conductor lines, and
   arranging one or more isolation regions, each isolation region juxtaposed one or more charge storage regions for one or more memory cells, each isolation region adjacent one or more conductor lines and juxtaposed one or more of the storage regions that are dummy storage regions
   providing tunneling gates in the memory cells, wherein the conductor lines include i) a plurality of first tunneling lines for electrically coupling the tunneling gates in array regions and ii) a plurality of second tunneling lines in the isolation regions.

* * * * *